United States Patent
Lee et al.

(10) Patent No.: US 6,933,218 B1
(45) Date of Patent: Aug. 23, 2005

(54) LOW TEMPERATURE NITRIDATION OF AMORPHOUS HIGH-K METAL-OXIDE IN INTER-GATES INSULATOR STACK

(75) Inventors: Tai-Peng Lee, Milpitas, CA (US); Barbara Haselden, Cupertino, CA (US)

(73) Assignee: Mosel Vitelic, Inc., Hsin Chu (TW)

( * ) Notice: Subject to any disclaimer, the term of this patent is extended or adjusted under 35 U.S.C. 154(b) by 0 days.

(21) Appl. No.: 10/866,380

(22) Filed: Jun. 10, 2004

(51) Int. Cl.[7] .................................. H01L 21/3205

(52) U.S. Cl. .................. 438/591; 438/199; 438/216; 438/275; 438/308; 438/694; 438/287; 438/585; 385/129

(58) Field of Search .................. 438/591, 199, 438/216, 275, 308, 694, 287, 585; 385/129

(56) References Cited

U.S. PATENT DOCUMENTS

| | | | |
|---|---|---|---|
| 4,795,679 A | * | 1/1989 | Ramesh et al. ............. 428/428 |
| 5,763,922 A | * | 6/1998 | Chau ......................... 257/371 |
| 6,001,748 A | * | 12/1999 | Tanaka et al. .............. 438/791 |
| 6,110,784 A | | 8/2000 | Gardner et al. |
| 6,251,761 B1 | | 6/2001 | Rodder et al. |
| 6,573,160 B2 | | 6/2003 | Taylor, Jr. et al. |
| 6,730,266 B2 | * | 5/2004 | Matson et al. ................ 422/44 |
| 2001/0024860 A1 | * | 9/2001 | Park et al. ................. 438/287 |
| 2002/0127867 A1 | * | 9/2002 | Lee ........................... 438/694 |
| 2003/0007763 A1 | * | 1/2003 | Bazylenko et al. ........ 385/129 |

OTHER PUBLICATIONS

Jin, Zhonge et al., "High–Performance Polycrystalline SiGe Thin–Film Transistors Using $Al_2O_3$ Gate Insulators," IEEE Electron Device Letters, vol. 19, No. 12, Dec. 1998, pp. 502–504.

Saito, Yoji and Tokuda, Koichi, "Atomic Scale Nitridation of Silicon Oxide Surfaces by Remote–Plasma–Excited–Nitrogen," Mat. Res. Soc. Symp. Proc., vol. 670, 2001, pp. K7.9.1–K7.9.5.

Skordas, Spyridon et al., "Low–temperature metalorganic chemical vapor deposition of $Al_2O_3$ for advanced complementary metal–oxide semiconductors gate dielectric applications," http://www.mrs.org/publications/imr/imra/2003/aug/022 . . . 1 page.

Yu, H.Y. et al., Thermal stability of $(HfO_2)_x(Al_2O_3)_{1-x}$ on Si, Applied Physics Lettesr, vol. 81, No. 19, Nov. 4, 2002, pp. 3618–3620.

* cited by examiner

Primary Examiner—Bradley Baumeister
Assistant Examiner—Victor V. Yevsikov
(74) Attorney, Agent, or Firm—MacPherson Kwok Chen & Heid LLP; Gideon Gimlan

(57) ABSTRACT

An OXO-type inter-poly insulator (where X is a high-K metal oxide and O is an insulative oxide) is defined by forming an amorphous metal oxide layer on a silicon-based insulator (e.g., a silicon oxide layer) and then nitridating at least upper and lower sub-layers of the amorphous metal oxide with a low temperature plasma treatment that maintains temperature below the recrystallization temperature of the amorphous material. Such a plasma treatment has been found to improve breakdown voltage characteristics of the insulator. In one embodiment, the metal oxide includes aluminum oxide and it is fluorinated with low temperature plasma prior to nitridation.

36 Claims, 8 Drawing Sheets

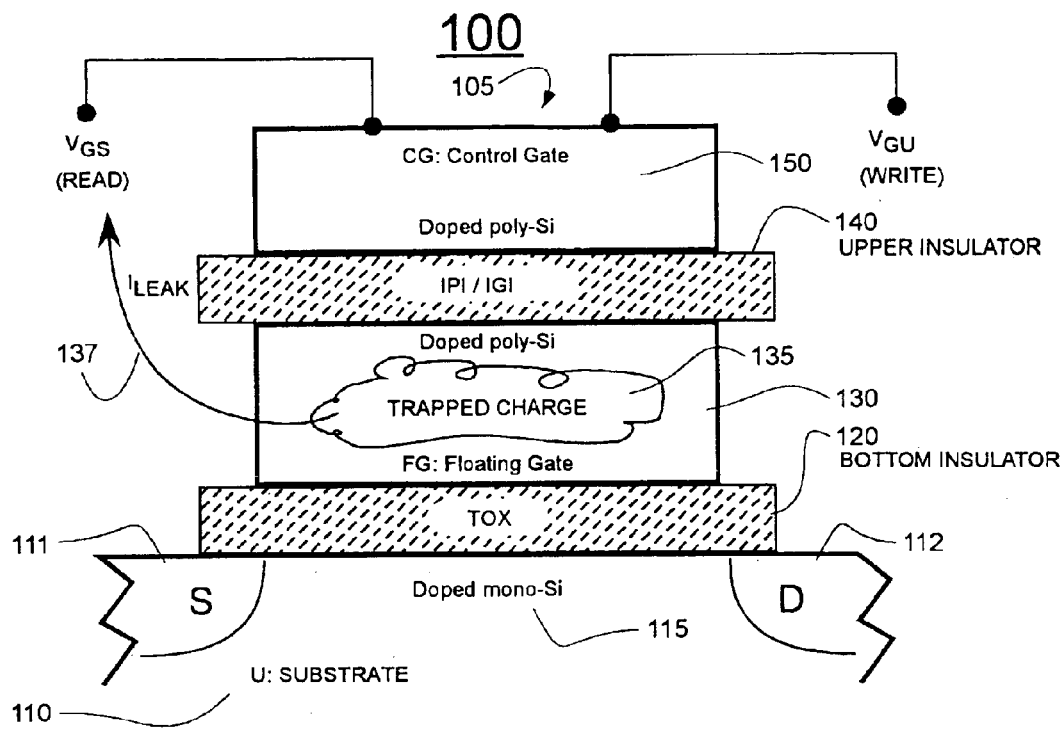
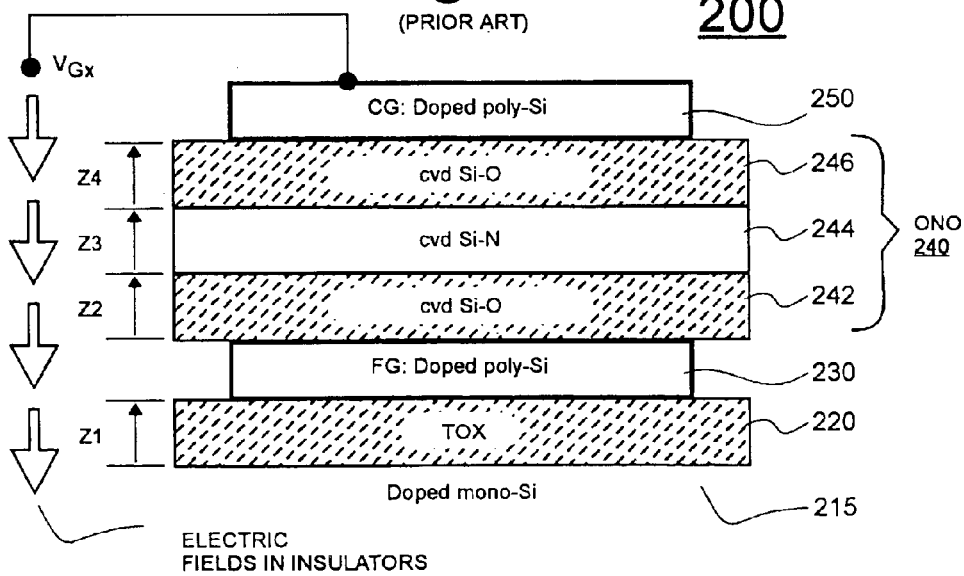

401 POLY-1 DEPOSITION

402 SiO FORMATION

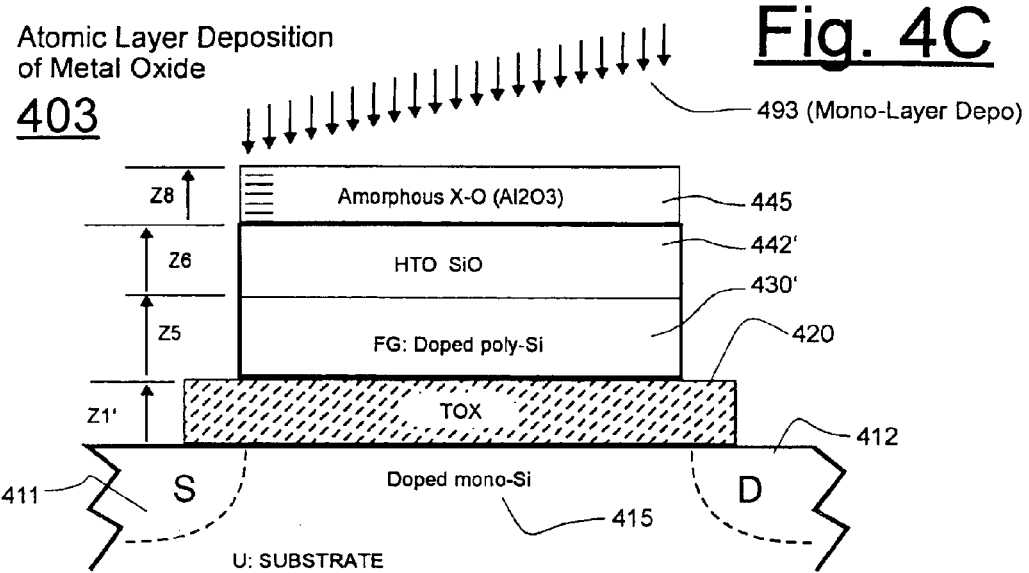
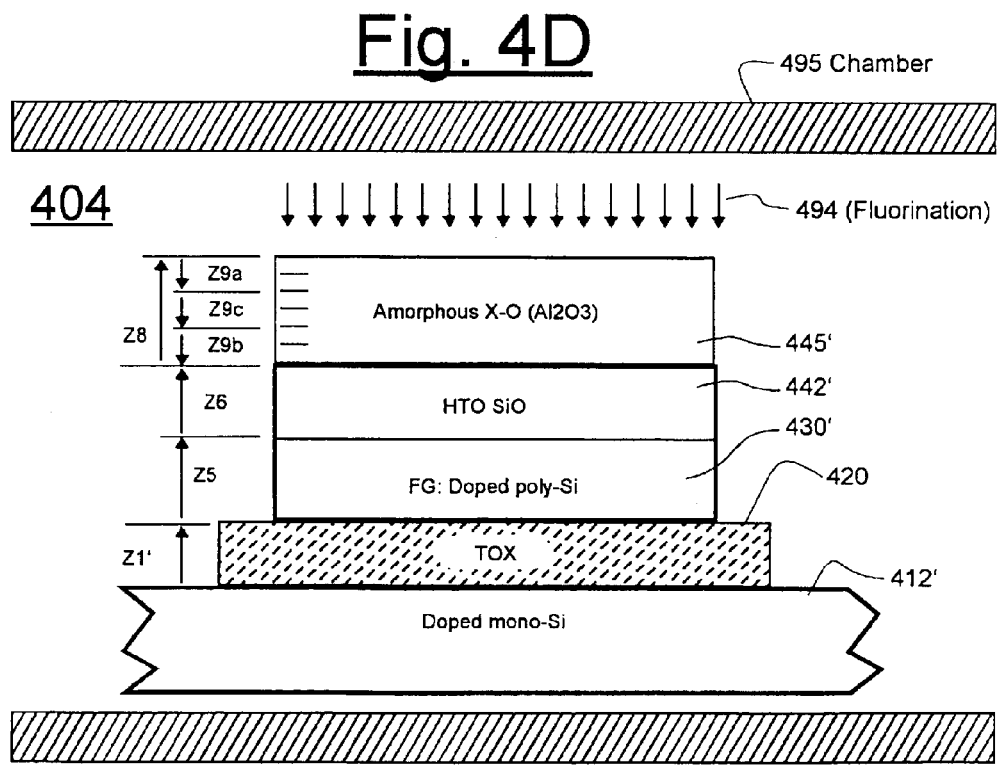

520

510

LOW TEMPERATURE NITRIDATION OF AMORPHOUS HIGH-K METAL-OXIDE IN INTER-GATES INSULATOR STACK

1. FIELD OF DISCLOSURE

The present disclosure of invention relates generally to semiconductor devices and to the manufacture of the same.

The disclosure relates more specifically to mass production of insulated gate field effect transistors (IGFET's, MOSFET's) which have plural gate electrodes separated from one another by electrically insulative materials. Yet more specifically, it relates to ONO-like structures which can be used to separate stacked conductive gates in electrically re-programmable and nonvolatile memory devices where a metal oxide is substituted for the middle nitride of the ONO stack.

2a. CROSS REFERENCE TO CO-OWNED APPLICATIONS

The following copending U.S. patent applications are owned by the owner of the present application, and their disclosures are incorporated herein by reference.

(A) Ser. No. 10/071,689 filed Feb. 8, 2003 by Zhong Dong et al and which is originally entitled, "Floating Gate Nitridation"; and (B) Ser. No. 10/243,379, filed Sep. 12, 2002 by Chuck Jang et al and which is originally entitled, "Atomic Layer Deposition of Interpoly Oxides in a Non-Volatile Memory Device".

2b. CROSS REFERENCE TO PATENTS

The disclosures of the following U.S. patents are incorporated herein by reference:

(A) U.S. Pat. No. 6,110,784 issued Aug. 29, 2001 to Gardner et al. and entitled "Method of Integration of Nitrogen Bearing High K Film";

(B) U.S. Pat. No. 6,251,761 B1, issued Jun. 26, 2001 to Rodder et al. and entitled "Process for Polycrystalline Silicon Gates and High-K Dielectric Compatibility";

(C) U.S. Pat. No. 6,613,695 B2, issued Sep. 2, 2003 to Pomarede et al. and entitled "Surface Preparation Prior to Deposition"; and (D) U.S. Pat. No. 6,573,160 issued Jun. 3, 2003 to Taylor, Jr., et al. and entitled "Method of Recrystallizing an Amorphous Region of a Semiconductor".

In order to avoid front end clutter, the cross referencing section continues as (2c) at the end of the disclosure, slightly prior to recitation of the patent claims.

3. DESCRIPTION OF RELATED ART

So-called, FLASH memory devices and other similar forms of electrically re-programmable and nonvolatile memory devices have become commercially popular due in part to their ability to store data in a small and dense form factors, their ability to repeatedly re-programmed, and their ability to retain programmed data in a nonvolatile fashion so that even when power is lost, the stored data is preserved.

One relatively simple form of such electrically re-programmable and nonvolatile memory is known as the vertically-stacked gate configuration. In this configuration, a so-called "floating gate" (FG) electrode is insulatively sandwiched between an underlying, tunnel insulator layer and an overlying, inter-gates insulator (IGI) layer. A so-called "control gate" (CG) electrode is stacked atop the inter-gates insulator (IGI) layer. A channel region with opposed source (S) an drain (D) regions often lies in a substrate region under the tunnel insulator layer.

Because of the way the layers stack, an undesirable charge leakage path may form between the floating gate electrode (FG) and the control gate electrode (CG), passing through the IGI layer (inter-gates insulator layer). The charge leakage mechanism may be attributed to the different kinds of dielectric materials in the IGI layer and to the ways in which those materials are stressed with various voltages as will be further explained shortly. It may be observed in passing, that beyond the vertically stacked gates configuration, there can be other types of more complicated configurations of gate electrodes, including various staggered gate configurations. The simpler, stacked gate configuration will be sufficient for describing the improvement disclosed herein.

The floating gate (FG) of a stacked gate memory cell is insulatively-isolated so that it may store a certain amount of charge and retain that charge not only when external power is turned off, but also when power is turned on and the insulation around the FG is stressed by the voltages used during data read operations. The amount of charge stored on the FG defines the data state of the memory cell. The state of the memory cell can be altered by moving charge into the FG for representing a first data state and by removing charge from the FG for representing another data state. Different mechanisms may be used for injecting charge into or removing charge from the FG, including hot carrier injection and/or Fowler-Nordheim tunneling. The charged or uncharged state of the floating gate (FG) can be sensed by applying a cell-read voltage $V_{GS-read}$ of predefined magnitude to the control gate (CG), where the cell-read voltage $V_{GS-read}$ is selected to cause a first magnitude of current conduction between the drain (D) and source (S) regions of the cell when the floating gate (FG) is in a first programmed state and to cause no or a different magnitude of $I_{DS}$ to flow when the floating gate (FG) is in another programmed state. (Some devices store multiple data bits per cell, where each of different amounts of charge trapped within the FG represents a different multi-bit pattern.)

It is important, for purposes of carrying out the various read and write operations of floating gate type memory cells (e.g., stacked gate cells), to establish an appropriate distribution of electric field lines and field intensities across the various insulators that surround the charge-storing, floating gate (FG) while the read or write operations are performed. These electric fields (E-fields) may be established by generating correspondingly appropriate voltages between the control gate (CG), the drain (D), the source (S) and/or substrate (U) regions of the memory cell. Those skilled in the art will appreciate that electric field intensity in dielectric insulators is usually a function of voltage difference (V) divided by dielectric thickness (d) and multiplied by dielectric constant (E=kV/d). In order to get consistent results from mass produced devices, it is important to maintain precise control over the dielectric thickness (d) and the dielectric constant (k) of the various insulators which surround the FG of each cell so that same results will occur in one device and the next for a given control gate voltage ($V_{CG}$). Stated otherwise, consistently same capacitive coupling should occur from one mass produced device to the next between the CG, the FG, the source (S), the drain (D) and the substrate (U).

Persons skilled in the art further appreciate that real-world insulators are generally not perfect. Small amounts of charge can undesirably leak through them due to unintended tunneling and/or other mechanisms. The insulator materials which are intended to keep charge bottled up in the FG can undergo unwanted high voltage breakdown if field intensity becomes too large in certain regions. Charge stored in the floating gate (FG) may then undesirably increase or decrease when this happens. Contaminating chemicals can pass into pinhole or other defects in the insulators and undesirably change their characteristics. This too can create problems. Guarding against all these possibilities is difficult, particularly as device dimensions shrink and performance demands increase.

Much progress has been made in the formulation of the so-called, thermal gate oxide insulator that usually lies between the substrate and the floating gate (FG). However, the inter-gates insulator layer (IGI) that is sandwiched between the FG and the CG still suffers from problems.

The inter-gates insulator layer (IGI) is particularly prone to problems with charge leakage and breakdown as already mentioned. Practitioners in the art have developed a so-called ONO solution. According to the basic ONO practice, after the material for the floating gate (FG) is deposited (typically it is doped polysilicon, although it could be a metal or another conductor, or a stacked combination of conductors), three insulative layers are vapor deposited in sequence. The three insulative layers are respectively composed of a silicon-Oxide, a silicon-Nitride and a silicon-Oxide; hence the ONO acronym. The material for the control gate (CG) is then deposited (typically it is doped polysilicon, although it could be a metal or another conductor or a conductive stack) on top of the ONO structure. The ONO structure works well because silicon-nitride ($Si_3N_4$) generally has a dielectric constant (K) which is greater than that of silicon dioxide ($SiO_2$). The higher dielectric constant of the silicon-Nitride layer allows cell designers to use lower gate voltages than would otherwise be possible for an equal thickness of insulator material made of only silicon-oxide. One commonly-used measure for the advantage gained by using the higher-K silicon nitride instead of the lower-K oxide is "EOT" (Effective Oxide Thickness). The EOT indicates to designers how much thinner a corresponding silicon dioxide layer would have been, had it (the oxide alone) been used instead of the thicker, high-K material in the ONO stack. Smaller EOT's allow designers to use smaller gate voltages. It is desirable to keep gate voltages relatively small so that power consumption can be reduced for dynamic operations. The ONO approach allows this to happen.

Despite improvements in vapor deposition and other techniques, the ONO approach still suffers from the presence of small leakage currents between the FG and the CG. Precise control of ONO thickness and control of material quality within the ONO stack also remains a problem. It has been proposed that the silicon nitride portion of the ONO stack be replaced with a dielectric material of yet higher dielectric constant (higher-K) so that the EOT of that middle part of the stack can be further reduced. The above-cited U.S. application Ser. No. 10/243,379 is an example of such a proposal. Possible candidates for the EOT reducing materials includes oxides of certain metals such as oxides of Al, Hf, Ti, Ta, Zr, La and Y. Unfortunately, despite their relatively high-K values, many of these metal oxide compositions posses other electrical and/or mechanical characteristics which are problematic. Among the problems are low break down voltage and high leakage current. The present disclosure discloses methods for improving such electrical characteristics of certain, high-K metal oxides.

INTRODUCTORY SUMMARY

Structures and methods may be provided in accordance with the present disclosure of invention for improving over the above-described art.

More specifically, in accordance with one aspect of the present disclosure, nitrogen atoms are incorporated into amorphous metal oxide compositions ($X_{(a)}$—O) such as those compositions which contain: amorphous aluminum oxide ($AlO_{(a)}$), amorphous hafnium oxide ($HfO_{(a)}$), amorphous titanium oxide ($TiO_{(a)}$), and/or amorphous tantalum oxide ($TaO_{(a)}$) while the $X_{(a)}$—O composition(s) substantially remain at relatively low temperature (e.g., less than about 330° C.), this being done so as to increase the break down voltage and/or reduce the leakage current of one or more of these amorphous constituents. The temperature(s) of the nitridation process is(/are) maintained below the recrystallization temperature(s) of the constituent amorphous metal oxides so that the high-K metal oxide(s) will substantially retain its (/their) amorphous structure(s) during nitridation and so that they will not develop large numbers of crystal grain boundaries or otherwise undergo undesirable phase changes. Large crystal grain boundaries are undesirable because they can serve as areas of amplified electric field intensity and/or as regions where conductive impurities aggregate and they can thereby promote premature voltage breakdown or excessive current leakage. Other phase changes to the amorphous structures of the high-K metal oxides may also be undesirable because designers of mass production devices wish to obtain consistent dielectric constant values from one device to the next. By keeping temperature below a critical one or more recrystallization temperatures during the nitridation process, substantial disruption of the amorphous structures of a corresponding one or more of the high-K metal oxides may be avoided while the benefit of nitridation is obtained.

Terms such as "amorphous" and "recrystallization temperature" can take on a variety of meanings depending on context. As used herein, "amorphous" takes on a relatively broad meaning and indicates that the structure is sufficiently disorderly at lesser scales of microscopic magnification as well as at greater scales of microscopic inspection so that substantially large and asymmetrical grain boundaries are not present to encourage electric field intensification and premature voltage breakdown. Polycrystalline structures may qualify within the scope of "amorphous," as used herein if the polycrystals are relatively small and randomly oriented on a large microscopic scale as well as on a smaller nano-scopic scale so that large grain boundaries are not seen to form between clumps of otherwise randomly oriented polycrystals. As used herein, "recrystallization temperature" refers to a temperature which an amorphous composition can be heated above and thereafter slowly cooled below, and as a result of the heating and cooling, the composition becomes substantially less amorphous and starts to exhibit significant grain boundaries, as may be evidenced by a significant reduction in dielectric breakdown voltage.

In accordance with a second aspect of the present disclosure, a downstream-microwave plasma reactor is used for introducing the nitrogen atoms at relatively low temperature (e.g., less than 330° C., this being low relative to furnace nitridation) into top and bottom surface regions of one or more layers of the amorphous metal oxide compositions while leaving an interim region, between the upper and lower regions, less disturbed. Different plasma reactors have different distribution profiles for introducing ions into thin layers of dielectric material. It has been found, for example, that the downstream-microwave processing mode of the GaSonics PEP Iridia DL™ system (GaSonics is now part of Novellus of California) tends to distribute nitrogen atoms across a 100 Å thick, dielectric layer with a distribution profile that has plural concentration peaks. More specifically, for distribution of nitrogen in silicon dioxide it was observed that a relatively low concentration of injected nitrogen occurs around the 10 Å–40 Å depth range and relatively much higher concentrations of injected nitrogen occur around the 0 Å–9 Å range and the 45 Å–60 Å range. Other types of nitridating plasma reactors have been found to have more uniform distribution for injected nitrogen across the roughly, 0 Å–100 Å depth range of silicon dioxide. For reasons that may not yet be fully understood, a multi-concentration peak injection of nitrogen atoms into a 60 Å thick, amorphous aluminum oxide layer appears to significantly improve resistance to dual-polarity breakdown. (Dual polarity refers to the challenging of the dielectric material's breakdown strength for both positive and negative voltage application across the dielectric layer.) It is possible that the increased nitrogen concentration at the top and bottom surface regions of the amorphous AlO layer seals oxygen atoms in the middle of the so-nitridated metal oxide layer an thereby preserves high-K performance. Alternatively or additionally, it is possible that the multi-peak nitrogen concentration profile between the top and bottom surface regions of the so-nitridated metal oxide layer behaves as a strong barrier to electron tunneling and thereby functions to reduce electron tunneling effects and as a consequence, improve the anti-leakage characteristics of the so-nitridated metal oxide layer. Different amounts of tunnel leakage may occur when an asymmetrically nitridated dielectric layer is subjected to stressing E-fields in both the positive and negative voltage directions. Irrespective of the correctness of such conjectured mechanisms, improved performance was observed when a below-described, dual frequency, downstream-microwave plasma reactor was used for incorporating nitrogen atoms into a high-K metal oxide layer.

In accordance with a third aspect of the present disclosure, a dual frequency, downstream-microwave plasma reactor is further used for introducing fluorine atoms at relatively low temperature (e.g., less than 330° C., this being low relative to furnace driven introductions) into the amorphous, metal oxide layer (e.g., AlO$_{(a)}$ layer) prior to introducing the nitrogen atoms. It is believed that the introduced fluorine atoms break or weaken metal-to-oxygen bonds (X—O bonds) in the amorphous, metal oxide layer (XO$_{(a)}$) and thereby encourage the formation of a greater number of metal-to-nitrogen bonds (X—N bonds) when the nitrogen atoms are subsequently introduced, also at relatively low temperature. The relatively low temperatures of the combined fluorination and nitridation plasma treatments are believed to help preserve the amorphous character of the metal oxide layer. This in turn, it is believed, works to inhibit the formation of large, field-concentrating grain boundaries in the inner regions of the amorphous metal-oxide structure and thereby also helps to inhibit premature electric insulation breakdown.

An insulating structure in accordance with the disclosure comprises: (a) a silicon oxide layer; and (b) an amorphous metal oxide layer which has been deposited by ALD or otherwise on the silicon oxide layer, where the amorphous metal oxide layer includes relatively large concentrations of nitrogen atoms at its top and bottom surface regions and a substantially smaller concentration of nitrogen atoms between its top and bottom surface regions. Such an insulating structure may be further characterized by the amorphous metal oxide layer having relatively large concentrations of fluorine atoms at its top and bottom surface regions and a substantially smaller concentration of fluorine atoms between its top and bottom surface regions.

An isolation providing method in accordance with the present disclosure comprises: (a) providing an amorphous metal oxide layer (XO$_{(a)}$) having a section of predefined thickness and a relative dielectric constant greater than about 4 (relative to air) at least in the section of predefined thickness, where the metal oxide layer is disposed on a supporting substrate and where the section of predefined thickness includes a top surface region, a bottom surface region, and an intermediate region between the top and bottom surface regions; (b) fluorinating the top surface region of the metal oxide layer; (c) nitridating the fluorinated top surface region of the metal oxide layer; (d) fluorinating the bottom surface region of the metal oxide layer; (e) nitridating the fluorinated bottom surface region of the metal oxide layer; and (f) maintaining a nitrogen concentration in the intermediate region that is substantially less than nitrogen concentration in the nitridated top and bottom surface regions so that relative dielectric constant in the intermediate region is about the same as the relative dielectric constant of the provided amorphous metal oxide layer (XO$_{(a)}$) prior to nitridation.

Other aspects of the disclosure will become apparent from the below detailed description.

BRIEF DESCRIPTION OF THE DRAWINGS

The below detailed description section makes reference to the accompanying drawings, in which:

FIG. 1 is a conceptual schematic diagram showing an environment in which it is desirable to form a good, but relatively thin, electrical insulator between two, conductively-doped semiconductor layers (e.g., to thereby form an inter-poly or inter-gates insulator);

FIG. 2A is a cross sectional schematic diagram showing how a conventional ONO structure is formed to serve as an inter-poly insulator between stacked gates of a nonvolatile memory device;

FIG. 4C is a cross sectional schematic diagram showing a third step (ALD deposition of amorphous metal oxide) in a continuation of the fabrication method of FIG. 3B;

FIG. 4D is a cross sectional schematic diagram showing a fourth step (low temperature fluorination) in a continuation of the fabrication method of FIG. 3C;

DETAILED DESCRIPTION

Figure 2B:
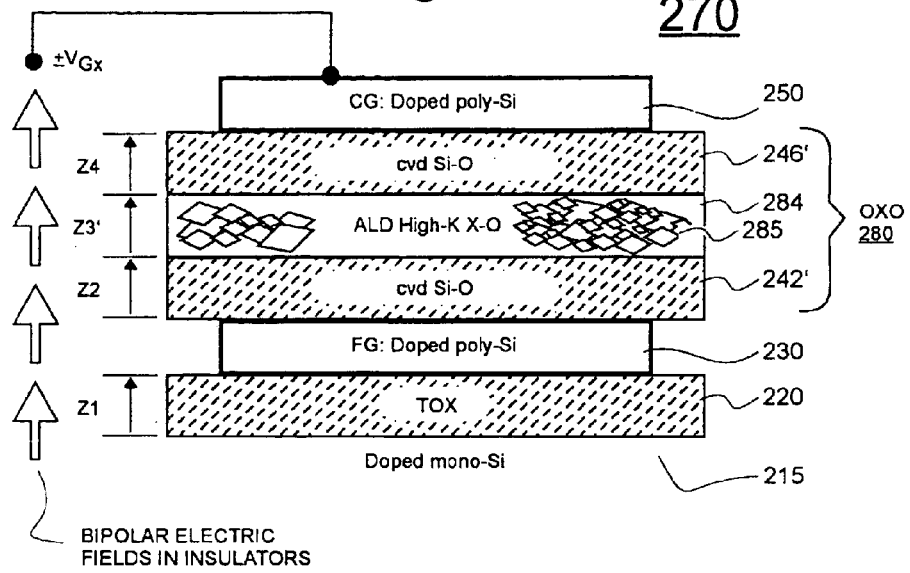
FIG. 2B is a cross sectional schematic diagram showing a proposed OXO structure for serving as an inter-poly insulator and further illustrating the problem of large polycrystalline grain boundaries.

FIG. 1 is a conceptual schematic diagram showing in cross section, an environment 100 in which it may be useful to form a good, but thin, electrical insulator 140 between two conductive layers, such as two conductively-doped semiconductor layers, 130 and 150. More specifically, the not-to-scale diagram of FIG. 1 shows the structure of a stacked-gate memory cell. The cell 105 is integrally formed as part of a monolithically integrated circuit having a common substrate 110. In one embodiment, the substrate 110 includes doped monocrystalline silicon. Spaced apart source (S) 111 and drain (D) 112 regions may be formed by the implant of suitable doping elements at opposed ends of an oppositely doped, channel portion 115 of the monocrystalline silicon substrate 110. A relatively thin oxide layer (so-called tunnel oxide, or TOX) may be provided on the surface of the channel portion 115. Typically, the TOX is thermally grown from the underlying, monocrystalline silicon 115. (The TOX may be thermally grown prior to threshold implant of dopants into channel portion 115 and prior to the implant doping of the source and drain regions, 111–112. Doping is understood to include the provision of impurity atoms such as boron, arsenic or phosphorus into the semiconductor crystal structure to impart P-type or N-type conductivity to the doped semiconductor region.)

A first, electrically-conductive gate electrode 130 is formed over the TOX layer 120, typically by chemical vapor deposition (CVD) of doped, polysilicon. A so-called, inter-poly or inter-gates insulator (IPI or IGI) 140 is formed over the first gate electrode 130. A second, electrically-conductive gate electrode 150 is formed over the IGI layer 140. Typically, the second gate electrode 150 is fabricated by CVD of doped polysilicon. (Although thermally-grown tunnel oxide and a polysilicon FG have been described, it is within the contemplation of the disclosure to alternatively use a high-K dielectric material and a metal respectively for the tunnel insulation 120 and the FG 130.)

Patterning of the gate electrodes (130, 150) may occur before or after the source/drain doping implants. Typically, the source/drain doping implants occur after patterning so as to provide for self-alignment of the doping profiles with the patterned gates. Additional insulative material (e.g., additional silicon dioxide) may surround the post-patterning sidewalls of the first and/or second gate electrodes 130–150 as well as those of the IGI layer 140. Alternatively, part or all of the FG-CG stack may be embedded in shallow-trench isolation (STI) wells as may be appropriate. No specific top-view patterning is intended by the conceptual side view of FIG. 1. During device fabrication, electrical connections are typically made to the second gate electrode 150 (hereafter also, the control gate or CG), to the source region (S) 111, to the drain region (D) 112, and to the substrate (U) 110, but not to the first gate electrode 130. The insulation-surrounded first gate electrode 130 is therefore commonly referred to as the floating gate (FG).

Those skilled in the art will appreciate that the floating gate (FG) 130 is typically used to nonvolatiley store trapped charge 135. This charge 135 may be injected into the FG 130 or removed from the FG 130 by way of hot carrier injection or Fowler-Nordheim tunneling, usually with the injected/extracted charge moving or tunneling through the tunnel insulator layer (TOX) 120. When charge is being purposefully injected into the FG 130 or being purposefully removed from it, a relatively large, writing voltage ($V_{GU}$) is typically established between the control gate (CG) 150 and the substrate (U) 110. Charge then tunnels or otherwise crosses through the thin TOX layer 120 in the desired direction to add to, or subtract from the amount of charge already present in the floating gate (FG) 130. The polarity of the applied electric field may be in either direction depending on whether charge is being intentionally added or removed from the FG 130. The write field (that of $V_{GU}$) generally passes through the IGI layer 140 and thereby stresses the IGI layer. If charge leakage 137 occurs through the IGI layer 140 during a write operation, the amount of charge left on the FG 130 may be other than what was intended.

It is desirable to have precise control over the amount of charge being moved into or being removed from the FG 130 during a write cycle because the amount of charge remaining in the FG after a write cycle will determine the memory state of the cell 105. More specifically, the state of the floating gate (FG) will be generally sensed by applying a cell-read voltage $V_{GS-read}$ between the control gate (CG) and the source region (S) 111 or another reference node. The magnitude of the cell-read voltage $V_{GS-read}$ will be pre-selected to cause a first magnitude of current, $I_{DS}$ (not shown) to flow between the drain (D) and source (S) regions of the cell when the floating gate (FG) is in a first programmed state (e.g., representing a binary 1) and to cause no or a different magnitude of $I_{DS}$ to flow when the floating gate (FG) is in another programmed state (e.g., representing a binary 0). The charged state of the FG 130 is not limited to just two distinct states. Some memory devices are designed to store multiple data bits per cell, where each of different amounts of charge 135 trapped within the FG represents a different one of the multi-bit patterns (e.g., 00, 01, 10 and 11). The above are just examples. The amount of charge 135 trapped within the FG 130 may alternatively represent an analog value.

The amount of charge moved into or out of the FG 130 during a write cycle is often determined by a number of factors including the distribution and intensity of electric flux lines through the TOX 120 and the composition and physical dimensions of the TOX. The latter, electric flux lines through the TOX are in their turn, often defined by the voltages present on the control gate (CG) 150, the drain (D) 112, the source (S) 111, and the substrate (U) 110 regions of the memory cell 105. The electric flux lines (not shown) are further defined by the composition and physical dimensions of the IPI/IGI layer 140. More specifically, those skilled in the art will appreciate that electric field intensity in the dielectric insulator or insulators of the IPI/IGI layer 140 will usually be a function of voltage gradient (V) across each of the insulators in the IGI, where the voltages are divided by the respective dielectric thickness (d) and multiplied by the respective dielectric constant (k) of the insulators. This may be roughly expressed as E=kV/d. (In actual practice, a more detailed analysis is often conducted using Maxwell's equations. There is no need to delve into such details here.)

It may be understood from the above that mass production fabrication of a multi-gate cells such as 105 shown in FIG. 1 will often call for precise control over the respective thicknesses (d) and the respective dielectric constants (k) of the various insulators which are provided around the FG 130. Repeated precision of thickness and of material characteristics is desired so that same results will occur in one mass produced device and the next for a given control gate voltage ($V_{CG}$) in combination with other voltages and further factors (e.g., temperature). In order to get such consistent results in mass produced devices, it is important to maintain consistency with respect to the dimensions and compositions of the insulators that that form the IGI layer 140 and the TOX 120. Stated otherwise, consistently same capacitive coupling should occur from one mass produced device to the next between the CG, the FG, the source (S), the drain (D) and the substrate (U).

Persons skilled in the art will appreciate that real-world insulators are generally not perfect. A small amount of leakage charge can undesirably flow through them. They can undergo high voltage breakdown. Contaminating chemicals can enter through pinhole or other defects in the insulators and change their characteristics. The inter-gates insulator layer (IGI) 140 is particularly prone to problems with leakage current because, unlike the TOX layer 120, the IGI 140 is generally sandwiched between two layers of doped polysilicon: the CG 150 and the FG 130. Artisans have learned that the IGI 140 will not be very good if it is manufactured merely with brute-force oxidation of the doped polysilicon in the FG layer 130. Practitioners in the art have developed to so-called ONO solution.

The conventional ONO solution is illustrated in the cross sectional view (not-to-scale) of FIG. 2A. After the TOX layer (220) is grown to a first thickness (Z1) and the doped polysilicon material for the floating gate (FG) 230 is deposited, three insulative layers are deposited in sequence, usually by means of CVD (chemical vapor deposition). The three insulative layers are respectively composed of a silicon-Oxide (242, having thickness Z2), a silicon-Nitride (244, having thickness Z3) and a silicon-Oxide (246, having thickness Z4); hence the ONO acronym (240). The material for the control gate (CG) 250 is then deposited (typically it is doped polysilicon) on top of the ONO structure 240. Because stoichiometric silicon-nitride ($Si_3N_4$) generally has a greater dielectric constant (k) than does silicon dioxide ($SiO_2$) or other silicon oxides ($Si_xO_y$), the higher dielectric constant of the silicon-Nitride layer 244 in the ONO stack 240 allows cell designers use lower gate voltages ($V_{GS-read}$, $V_{GU-write}$) than would otherwise be necessary for an equal thickness (Z2+Z3+Z4) of insulator material made of only silicon-oxide. It is desirable to keep gate voltages relatively small. Thus the ONO solution has become very popular.

Despite improvements with vapor deposition or other fabrication techniques, the ONO approach still suffers from the presence of leakage current 137 ($I_{LEAK}$) between the FG (130, 230) and the CG (150, 250). Precise control of ONO thickness (Z2+Z3+Z4) and material quality within the ONO stack 240 remains a problem.

One improvement over the conventional ONO structure 240 (FIG. 2A) is disclosed in the above-cited U.S. patent application, Ser. No. 10/071689 ("Floating Gate Nitridation"). Briefly, a small amount of nitrogen (e.g., about 1%–20% atomic) is introduced into the top surface of the doped-polysilicon FG layer after the layer is deposited. The nitridated layer is subjected to a high temperature oxygen-containing atmosphere. Silicon atoms in the nitridated layer are scavenged by the hot oxygen-containing atmosphere to form a thermally-grown, silicon oxide on the top surface. The increased concentration of nitrogen in the silicon-scavenged area stops the oxidation front from moving deeper into the FG layer. Such a silicon-scavenging oxidation process allows a higher quality of silicon oxide (thermal oxide) to form atop the nitridated FG layer than would be possible with conventional CVD formation of silicon oxide. The silicon-scavenging oxidation technique provides a NONO insulator structure with enhanced insulative properties. However the middle silicon nitride layer in the NONO stack remains as before. Room for yet further improvement is remains.

Another improvement over the conventional ONO structure 240 (FIG. 2A) is disclosed in the above-cited U.S. patent application, Ser. No. 10/243,379 ("Atomic Layer Deposition of Interpoly Oxides in a Non-Volatile Memory Device"). Briefly, a higher-K metal oxide such as ALD deposited, aluminum oxide is used in place of the middle silicon nitride layer in the ONO stack. The 10/243,379 application teaches to anneal the metal oxide after deposition at a temperature of 950° C. or higher. The present inventors have discovered that such high temperature annealing can be detrimental to device performance.

Moreover, the present inventors have discovered that low temperature plasma treatment, at temperatures less than the recrystallization temperatures of the utilized, high-K metal oxides (e.g., Al—O) can be used to improve the breakdown characteristics of an OXO stack that includes a high-K metal oxide (e.g., Al—O) in the X portion of the OXO stack. The present inventors have discovered that a combination of low temperature plasma fluorination followed by low temperature plasma nitridation provides good results for an OXO stack that includes amorphous aluminum oxide in the X portion of the OXO stack.

FIG. 2B is a cross sectional view (not-to-scale) similar to FIG. 2A where the ONO stack 240 of FIG. 2A is replaced by an OXO stack 280. The salient feature in the multi-gate structure 270 of FIG. 2B is that a high-K material layer 284, composed of one or more, metal oxides such as aluminum oxide, hafnium oxide, zirconium oxide, tantalum oxide, and/or titanium oxide, is integrally interposed between silicon oxide layer 242' and 246'. The vertical thickness, Z3' of the high-K material layer 284 can be larger than the comparable thickness Z3 (FIG. 2A) of the replaced silicon nitride layer 244 because the high-K material has a greater relative dielectric constant. Alternatively, substantially smaller control-gate voltages ($V_{Gx}$) may be used if Z3' is about the same or slightly less than comparable thickness Z3 (FIG. 2A) and the electric field intensities may remain roughly the same across the tunnel oxide (TOX) 220. As indicated in FIG. 2B, the high-K X—O layer 284 may be fabricated by way of atomic layer deposition (ALD).

Table 1 (below) provides examples of high-K materials that may be used in place of the more conventional silicon dioxide or silicon nitride. In addition to showing the approximate, relative dielectric constants of the materials and their energy band gaps, Table 1 shows approximate, recrystallization temperatures for various ones of the materials. Recrystallization temperatures can vary depending on the original crystallographic phase of the specific material and the presence of various impurities. Therefore the values given in Table 1 are not binding. Irrespective of the precise recrystallization temperature of any one of the listed compounds, it may be seen that the higher-K materials tend to have recrystallization temperatures which can be significantly less than 950° C.

TABLE 1

| Material | Dielectric Constant | Energy Gap (eV) | Recrystallization Temp |
|---|---|---|---|
| $SiO_2$ | 3.9 | 9.0 | — |
| $Si_3N_4$ | 7.0 | 5.0 | — |
| $Al_2O_3$ | 8.0 | 7.0 | ~900° C. |
| $HfO_2$ | 20–25 | 5.7 | ~400° C. |
| $ZrO_2$ | 20–25 | 5.2 | ~300 to 550° C. |
| $TaO_2$ | 60–80 | 3.2 | ~700 to 950° C. |
| $TiO_2$ | 23–26 | 4.2 | ~300 to 550° C. |

Recrystallization of a high-K material can be undesirable in situations such as that of FIG. 2B because the re-crystallized material may exhibit relatively large grain boundaries 285, and the latter may cause non-uniform distribution of electric field intensity and/or premature dielectric breakdown. The premature dielectric breakdown may occur for only one direction of electric field polarity first rather than equally for both directions because the formation of large grain boundaries 285 may be asymmetrical with respect to device geometry. The present inventors have investigated the phenomenon of premature dielectric breakdown in the presence of a swept electric field where the field sweeps through both the positive and negative voltage ranges.

It may be seen from Table 1, that aluminum oxide is a good material candidate for serving as a high-K metal oxide substitute for silicon nitride because of AlO's relatively high energy gap (which leads to smaller charge leakage through the layer) and because of its higher dielectric constant. Amorphous aluminum oxide is desirable because it does not have relatively large grain boundaries of the type that might be present in a semi-monocrystalline or polycrystalline form of the material. Atomic layer deposition (ALD) may be used for producing a thin layer of amorphous aluminum oxide. (No specific ALD technique is considered better than another at the present time by the inventors.) Because of the desirable properties of aluminum oxide, the remainder of this specification will deal primarily with this material as a substitute high-k dielectric material to be deposited by ALD in the middle of an OXO structure 280. However, the teachings and techniques disclosed herein may be applied to other high-k dielectric materials (e.g. those listed in Table 1). Those skilled in the art will appreciate that ALD is related to CVD (chemical vapor deposition) except that only one reactant at a time is pulse-supplied through the deposition chamber. A first of the pulse-supplied reactants adheres to the substrate surface as a chemisorbed monolayer. The second pulse-supplied reactant is provided to react with the chemisorbed monolayer of the first reactant to thereby form a monolayer of the desired reaction product (e.g., aluminum oxide). The process of pulse-supplying the first reactant and then the second is repeated M times until a product layer that is M monolayers thick is formed. The thickness of an ALD-defined layer such as 284 can be digitally controlled by the setting of the deposition repetition factor N. Thus, the thickness Z3' of ALD-defined layer 284 can be precisely controlled.

Figure 3A:
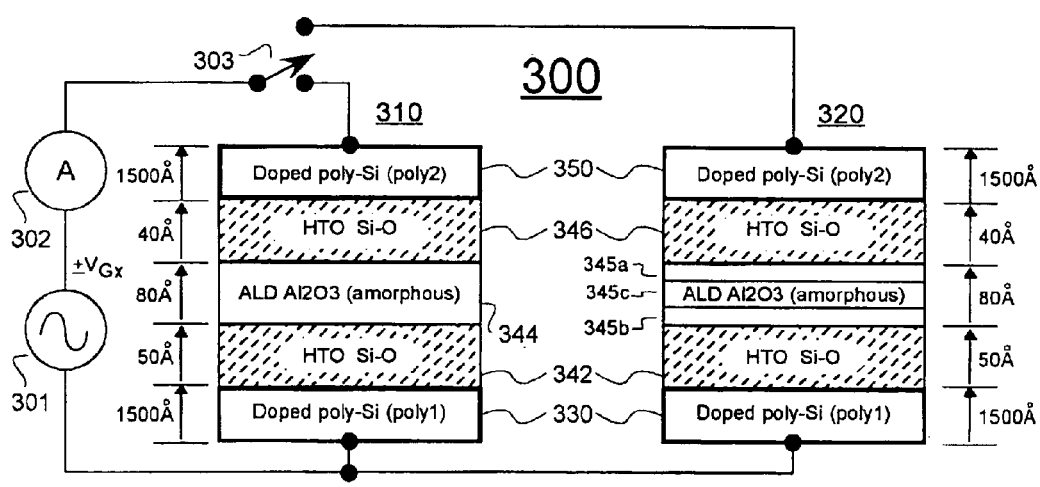
FIG. 3A is a cross sectional schematic diagram showing a test environment that was used for measuring results on one embodiment in accordance with the present disclosure.

FIG. 3A is a cross sectional schematic diagram showing an experiment carried out by the present inventors. Leakage current versus voltage plots (e.g., FIGS. 3B, 3C) were generated using a voltage generator 301 that was swept between 0 V and −20 V. An ammeter 302 capable of sensing current down to a resolution below that of 1 microamp (1E-06 amps) was placed in series with the swept voltage generator 301 and each of two, slightly different capacitor structures, 310 and 320, were tested for IV characteristics. Switch 303 represents the switching from one experimental regime to the other with substantially no change other than that made to a metal oxide layer 344 as shall be detailed shortly.

Each of the tested, capacitor structures 310 and 320 was fabricated using a same-sized, silicon wafer as a substrate. A first layer 330 of conductively doped, polycrystalline silicon (poly-1) was deposited by CVD to a thickness of 1500 Å and same surface area on each wafer. A next higher layer 342 of silicon oxide was formed by High Temperature Oxidation (HTO) to a thickness of 50 Å, again with a same surface area on each of the test wafers 310–320. For each of structures 310 and 320, a next higher layer 344 of amorphous aluminum oxide was formed by ALD to a thickness of 80 Å and same area. No additional treatment was provided for the amorphous $Al_2O_3$ layer 344 of first structure 310.

On the other hand, the amorphous $Al_2O_3$ layer of second structure 320 was subjected to a combination of low temperature plasma fluorination followed by low temperature plasma nitridation. In one embodiment, the combined fluorination and nitridation steps were carried out in a plasma reactor that has a tendency to produce spaced-apart concentration peaks of introduced atoms where the peaks are about 60–80 Å apart. It is believed that the resulting structure in the second capacitor 320 was therefore organized to have well-nitridated, top and bottom surface regions, 345a and 345b; and also, possibly, a substantially less nitridated intermediate region 345c between regions 345a and 345b. The plasma reactor tool used was a dual frequency, downstream-microwave, GaSonics PEP Iridia DL™ system (GaSonics is now part of Novellus of California). Details of the plasma recipe will be provided later below.

Aside from the separate, low temperature, plasma treatment applied to the aluminum oxide layer 345a–345c–345b of the second capacitor structure 320, the remainder of the fabrication of capacitor structures 310 and 320 was substantially the same. A next higher layer 346 of silicon oxide was formed by High Temperature Oxidation deposition (HTO) to a thickness of 40 Å again with a same surface area on each of the test wafers 310–320. CVD was used to deposit a next higher layer 350 of conductively doped, polycrystalline silicon (poly-2) to a thickness of 1500 Å and same area. Similar metallized contacts were made to the respective bottom and top of polysilicon layers 330 and 350 for coupling the corresponding capacitor structures 310 and 320 to test elements 301 and 302. IV plots were produced and are shown in FIGS. 3B and 3C respectively for capacitor structures 310 and 320.

Figure 3C:
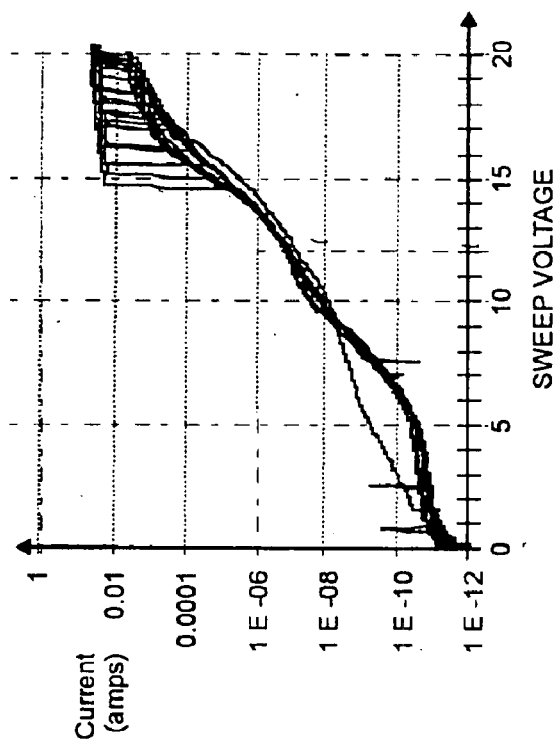
FIG. 3C is a plot of current versus sweep voltage that shows observed breakdown for the nitridated/fluorinated test structure of FIG. 3A.
Figure 3B:
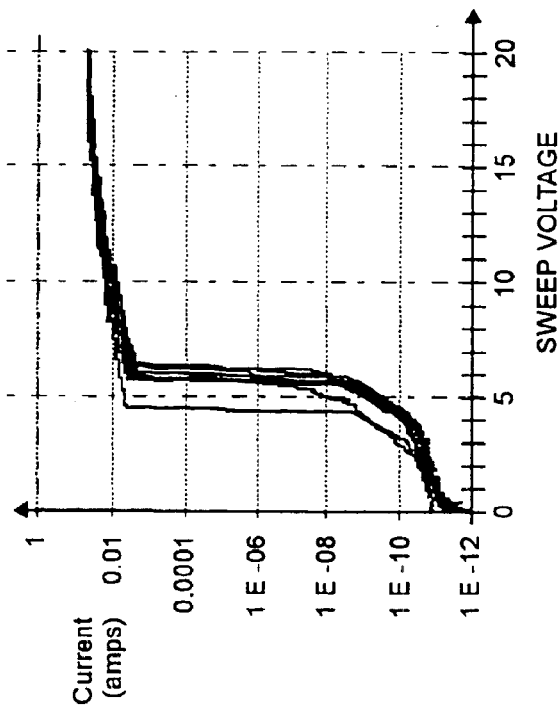
FIG. 3B is a plot of current versus sweep voltage that shows observed breakdown for the non-nitridated test structure of FIG. 3A.

Referring to FIG. 3B, it can be readily seen that leakage currents in excess of 1 μA (1E-06 Amp) flowed through the first capacitor structure 310 when the absolute value of the swept negative voltage, $-V_{Gx}$ was above about 4 V to 5 V. The large increase in current magnitude of several orders of magnitude for a small increase to voltage (e.g., increasing from 4 V to about 4.5 V to 5 V) is indicate of a voltage breakdown mode. More specifically, the leakage currents of the first capacitor structure 310 were observed to rapidly rise from under 1E-10 A to above 1E-6 A (a jump of at least 4 orders of magnitude) as the swept voltage, $-V_{Gx}$ shifted from the 0 V–4 V absolute value domain to the domain above about 4.5 V. The leakage currents of the first capacitor structure 310 were observed to start crossing above the 0.01A magnitude (that is about 8 orders of magnitude above the sub-1E-10 A level of the sub-4V absolute domain) as the swept voltage $-V_{Gx}$ crossed below −10 V. These, latter magnitudes of leakage current are unacceptable for memory devices whose control gates (CG) will be stressed with voltages in the absolute value range of 5–12 V. Of course the absolute values of the observed leakage currents are functions of the 0.1 mm² area of the utilized, on-wafer, test site. The absolute values of expected leakage currents in smaller IC die should be proportionally smaller. It is the relative increase of leakage current by orders of magnitude for a small increase in voltage (e.g., 0.5 V) that is indicative of the voltage breakdown mode taking hold. Once surge currents flow due to voltage breakdown, the structure of the broken-through dielectric may be permanently damaged as a result of heat induced changes or the like and the breakdown voltage may be lower than it was before the first breakdown.

Referring to FIG. 3C, it can be readily seen that leakage currents through the second capacitor structure 320 were orders of magnitude less than −1 μA when the absolute value of the swept negative voltage, −$V_{Gx}$ was at about 4 V to 5 V and that such leakage currents remained substantially below −1 μA even as the swept voltage −$V_{Gx}$ crossed above 10 V and above 12 V in terms of absolute magnitude. Significant dielectric breakdown is seen to begin at about 15 V and higher. (Some of the current spikes observed at the lower absolute voltages—below 14 V—may be artifacts of environmental noise rather than actual leakage.)

With regard to the improved performance seen in FIG. 3C, as compared to FIG. 3B, it is believed that the low temperature nitridation process was responsible for the observed improvement. It is believed that the low temperature nitridation process caused nitrogen atoms to bond into the metal-oxide complex and/or to stuff the sub-microscopic grain boundaries of the amorphous aluminum-oxide layer 345a–345c–345b of the second capacitor 320 and that this binding and/or boundary stuffing was responsible for the observed reduction in leakage current over the swept bipolar voltage range of 0 V to about 14 V. It is believed that similar improvements can be expected with other amorphous and high-K metal oxide compositions if they are subjected to the low temperature fluorination and low temperature nitridation treatments described herein where the low temperatures are below the recrystallization temperatures of the high-K materials present in the stack.

Figure 4A:
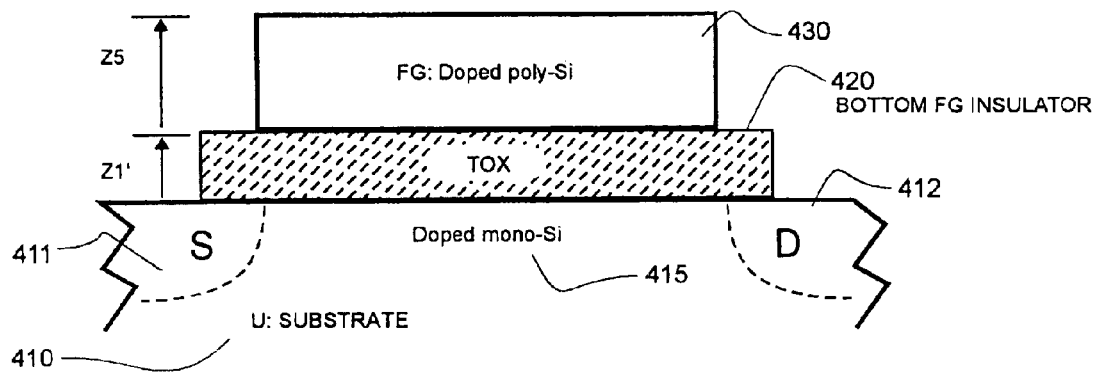
FIG. 4A is a cross sectional schematic diagram showing a first step (poly-1 deposition) in an IGI fabrication method in accordance with the present disclosure.

Referring to FIG. 4A, a cross sectional schematic diagram is provided for showing a first step 401 (Poly-1 deposition) in an IGI fabrication method according to the present disclosure. Briefly, after TOX layer 420 is thermally-grown to thickness Z1' from monocrystalline substrate 410, a doped polysilicon layer 430 is deposited by CVD or otherwise to thickness Z5. In one embodiment, thickness Z5 is in the range of about 1000 Å to about 2000 Å. TOX thickness Z1' is in the range of about 10 Å to about 100 Å, and in a more specific set of embodiments, Z1' is in the range of about 50 Å to about 90 Å. The source and drain regions 411, 412 are typically not yet formed at this stage and are shown in phantom (dashed lines) simply to provide a point of reference for what will later develop around channel region 415 of the monocrystalline silicon substrate, 410. (Although formation of a thermally-grown tunnel oxide 420 and CVD of a polysilicon FG 430 have been described, it is within the contemplation of the disclosure to alternatively use a high-K dielectric material and a metal respectively for the tunnel insulation 420 and the FG 430 and to further provide an OXO structure above these.)

Figure 4B:
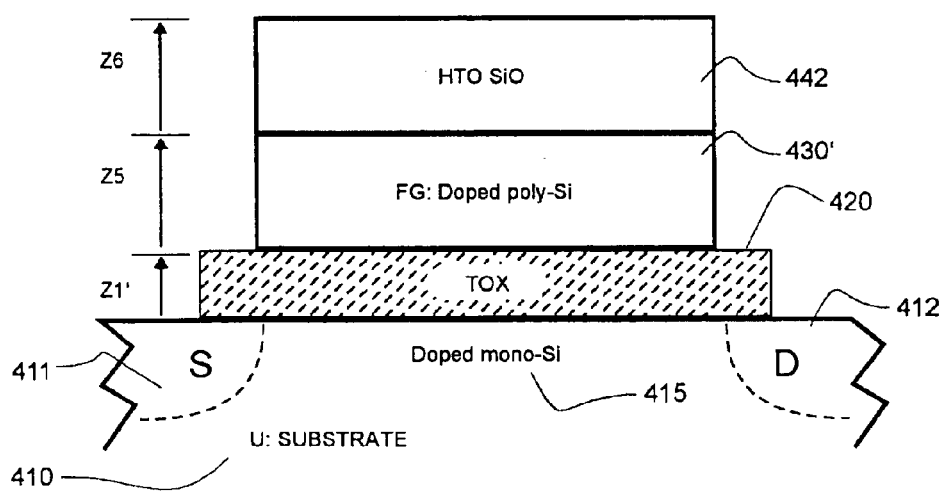
FIG. 4B is a cross sectional schematic diagram showing a second step (oxide formation) in a continuation of the fabrication method introduced by FIG. 3A.

FIG. 4B is a cross sectional schematic diagram showing a second step 402 (SiO formation) in a continuation of the fabrication method introduced by FIG. 4A. In second step 402 a silicon oxide layer 442 is formed on polysilicon layer 430' to thickness Z6. Formation may be by way of HTO deposition, HDP (High Density Plasma) deposition, more-conventional CVD or other wise as may be appropriate. In one embodiment, thickness Z6 is in the range of about 30 Å to about 100 Å. In an alternate embodiment, a nitrogen-stopped thermal growth of the SiO layer 442 may be carried out in accordance with the disclosure of the above-cited and incorporated, U.S. Ser. No. 10/071,689 by Zhong Dong et al ("Floating Gate Nitridation"). A thin nitridated layer (not shown) would be first formed slightly below the top surface of FG layer 430' and silicon atoms would be scavenged by thermal oxidation to form part or all of the overlying SiO layer 442.

Referring to FIG. 4C, in a next step 403, an amorphous metal oxide material (X—O) such as a high-K one chosen from Table 1 is formed to a thickness Z8 on top of silicon oxide layer 442'. Formation may be by way of a variety of different techniques including CVD and ALD. Atomic Layer Deposition (ALD) 493 is generally preferred because it allows for precise control of the layer thickness Z8. No specific ALD technique is currently preferred over others and alternate methods for forming the amorphous metal oxide may be used, including CVD or reactive sputtering.

In one embodiment, an amorphous aluminum oxide layer is formed as layer 445 via an ALD process 493 as follows. An aluminum tri-methyl precursor gas is introduced alternating with pulses of ozone or water vapor into the reaction chamber. Genus, Inc. of Sunnyvale, Calif. manufactures one ALD tool (Genus LYNX™ Series Model ALD Chamber) that can be used in connection with the process described here. Other usable such tools are the ASML™ and Patheon™ tools. In one embodiment, the $Al(CH_3)_3$ precursor gas is introduced for chemisorption onto the pre-cleaned substrate at a temperature of about 300–450° C. and a pressure of about 10–100 Torr. The precursor atmosphere is maintained for sufficient time to saturate the wafer surface with a monolayer. The chamber is then purged with an inert gas such as nitrogen, helium, or argon to remove any excess or residual parts of the aluminum tri-methyl or of undesirable other substances. Next, an oxidizing gas is introduced, such as water vapor or ozone. The oxidizing gas oxidizes the chemisorbed precursor monolayer and causes the substrate surface to have a monolayer of aluminum oxide disposed thereon. Saturation of the surface typically occurs within milliseconds of exposure to the activating gases. Next, the chamber is again purged with an inert gas, such as argon or nitrogen, to reduce or eliminate the oxidizing gas and any undesired substances. Another pulse of the methyl precursor is introduced and the process is repeated N times so that a high-K thin film of a thickness of N monolayers forms, one monolayer at a time. Generally, the ALD deposition thickness is in the range of about 50 Å to 130 Å. In the experiment of FIGS. 3A–3C it was 80 Å. Because of the way the sequential monolayers self-organize themselves for minimal enthalpy, the resultant structure should be of a fairly uniform amorphous organization without showing any pronounced grain boundaries. It is within the contemplation of the disclosure to alternatively use other high-K dielectrics in place of stoichiometric aluminum oxide.

Referring to FIG. 4D, in a next step 404 the amorphous and high-K metal oxide layer is fluorinated. In one embodiment, a low temperature plasma reactor 495 such as for example, the GaSonics PEP Iridia DL™ is used where the plasma treatment keeps the temperature of the amorphous and high-K metal oxide layer 445 below its recrystallization temperature. In the case of aluminum oxide, that is about 900° C. In order to encourage the bonding of nitrogen atoms into the metal oxide complex, fluorine atoms 494 are first introduced at least into depth zones Z9a and Z9b of the metal oxide layer 445'. In one embodiment, the concentration of fluorine atoms in intermediate depth zone Z9c is substantially less than the fluorine concentration in upper and lower zones Z9a and Z9b. More specifically, for one embodiment (320 of FIG. 3A), the fluorination recipe is as follows using the GaSonics dual frequency, downstream-microwave, PEP Iridia DL™ system:

Pressure: about 0.1 to about 1 Torr
Temperature: about 40° C.
Input gas: includes a flow of about 50 sccm of $NF_3$
Application time: about 1 second to 60 seconds
Microwave Power: 1700 Watts
Microwave Frequency: 2.45 GHz The above fluorination recipe is merely an example. More broadly speaking, any one or more of the following alternate ranges may be substituted:

Pressure: about 0.05 to about 2 Torr
Temperature: about 20° C. to 90° C.
Input gas: includes a flow of about 30 sccm to 1000 sccm of $NF_3$ with optional inclusion of $N_2$ and/or Ar
Application time: about 1 second to 180 seconds
Microwave Power: 1700 Watts
Microwave Frequency: 2.45 GHz Yet other gases which may serve as a source of fluorine within the plasma include: $CF_4$, $SiF_4$, and $SiF_6$. Fluorination may be carried out with methods other than dual frequency, downstream-microwave plasma. One example of an alternate method is RPF (Remote Plasma Fluorination) with a $CF_4/N_2$ mixture.

Figure 4E:
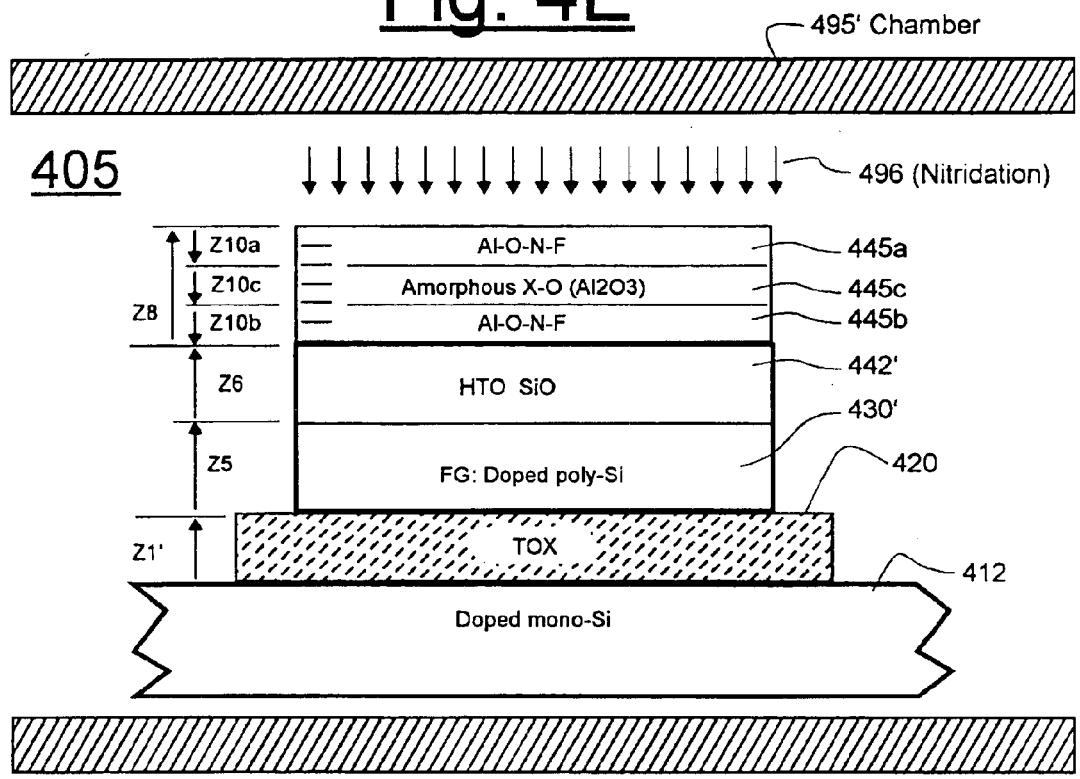
FIG. 4E is a cross sectional schematic diagram showing fifth step (low temperature nitridation) in a continuation of the fabrication method of FIG. 3D.

Referring to FIG. 4E, in a next step 405 the pre-fluorinated, amorphous and high-K metal oxide layer is nitridated. In one embodiment, the same a low temperature plasma reactor 495' that was used for fluorination (GaSonics PEP Iridia DL™) is used again to provide a further plasma treatment that keeps the temperature of the amorphous and high-K metal oxide layer, especially in region 445c below its recrystallization temperature. In the case of aluminum oxide, that is about 900° C. Pre-fluorinated regions 445a and 445b should contain a sufficient concentration of fluorine atoms to encourage bonding of the supplied nitrogen atoms (496) into the metal oxide complex. In one embodiment, the concentration of nitrogen atoms introduced into intermediate depth zone 445c (having width Z10c) is substantially less than the nitrogen concentration in upper and lower zones 445a (having width Z10a) and 445b (having width Z10b). If the same plasma treatment tool is used for both fluorination and nitridation then dimension Z10a should be about the same as dimension Z9a, Z10b should be about the same as Z9b, and Z10c should be about the same as Z9c. More specifically, for one embodiment (320 of FIG. 3A), the nitridation recipe is as follows using the GaSonics PEP Iridia DL™ system:

Pressure: about 0.8 to about 1 Torr
Temperature: about 270° C.
Input gas: includes a flow of about 1000 sccm of one or a mixture of the nitrogen-providing group including $N_2$ and $N_2H_2$
Application time: about 60 to 180 seconds
Microwave Power: 1700 Watts
Microwave Frequency: 2.45 GHz.

The above nitridation recipe is merely an example. More broadly speaking, any one or more of the following alternate ranges may be substituted:

Pressure: about 0.5 to about 2 Torr
Temperature: about 250° C. to 330° C.
Input gas: includes a flow of about 500 sccm to 3000 sccm of one or a mixture of the nitrogen-providing group including $N_2$ and $N_2H_2$ and with optional inclusion of Ar and/or another noble gas
Application time: about 30 to 240 seconds
Microwave Power: about 1500 to about 2000 Watts Nitridation may be carried out with methods other than RF plasma. One example of an alternate method is DPN (Decoupled Plasma Nitridation). Pressure can be about 5 milliTorr for the DPN process.

Figure 4F:
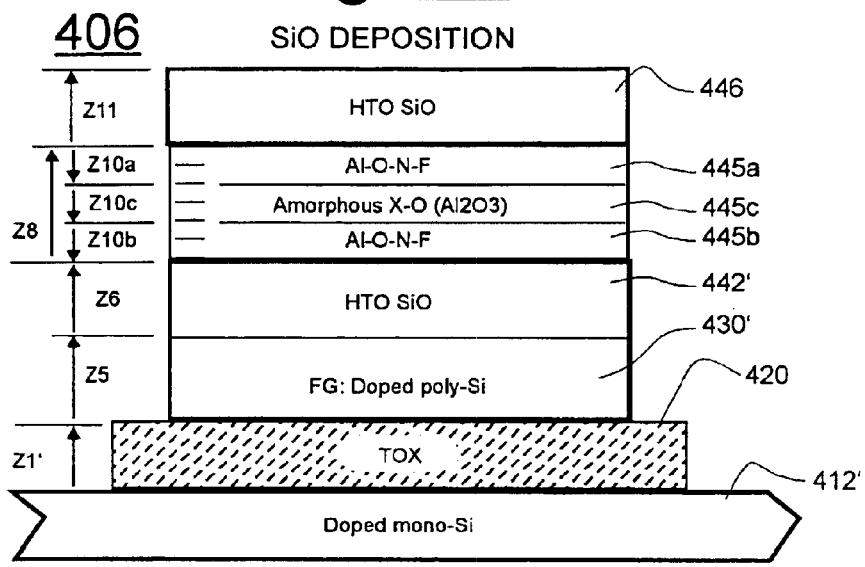
FIG. 4F is a cross sectional schematic diagram showing an sixth step (vapor deposition of SiO) in a continuation of the fabrication method of FIG. 3D.

Referring to FIG. 4F, in a next step 406 a silicon oxide layer 446 ($Si_x = O_y =$) is deposited (by CVD, ALD or otherwise) to a thickness Z11 on top of the higher-K dielectric layer 445a–c. This is followed in a subsequent step 407 by deposition (via CVD or otherwise) to a thickness Z12, of the polycrystalline silicon material that will define the conductively doped, CG layer 450. The conductivity-defining dopants of layer 450 may be introduced during the deposition of the polycrystalline silicon material of CG layer 450 and/or afterwards by ion implant.

Figure 4G:
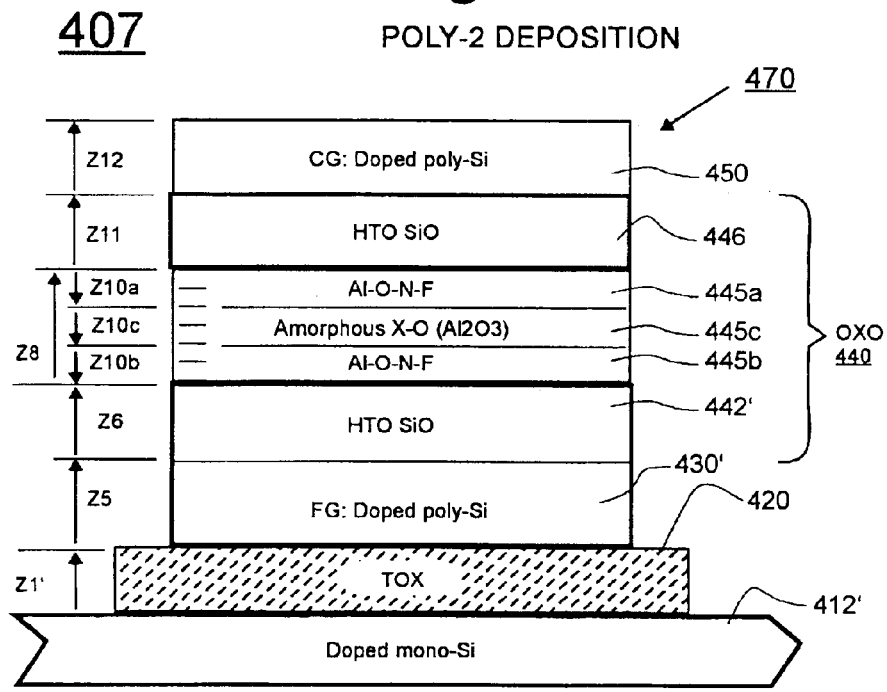
FIG. 4G is a cross sectional schematic diagram showing a further step (CVD deposition of CG) in a continuation of the fabrication method of FIG. 3F.

FIG. 4G illustrates the substantially completed, multigate structure 470 in which two, conductively doped, polysilicon gate electrodes, 430' (FG) and 450 (CG) are insulated from each other by an OXO structure 440 that includes at least one, nitridated metal oxide layer 445 that includes top and bottom regions 445a and 445b having greater concentration of nitrogen atoms than intermediate region 445c. This OXO structure 440 provides enhanced protection against leakage currents and premature breakdown. (See again FIG. 3C). In a slightly modified version, the top or a deeper part of SiO layer 442' may also be nitridated, for example by methods disclosed in the above cited U.S. Ser. No. 10/071,689. Although not shown, sidewall insulation about the FG 430' and other parts of the stack may be provided by CVD or other deposition of silicon oxide or the like or by containment of the part or all of the stack in a shallow isolation trench (STI) or equivalent structures.

Figure 5B:
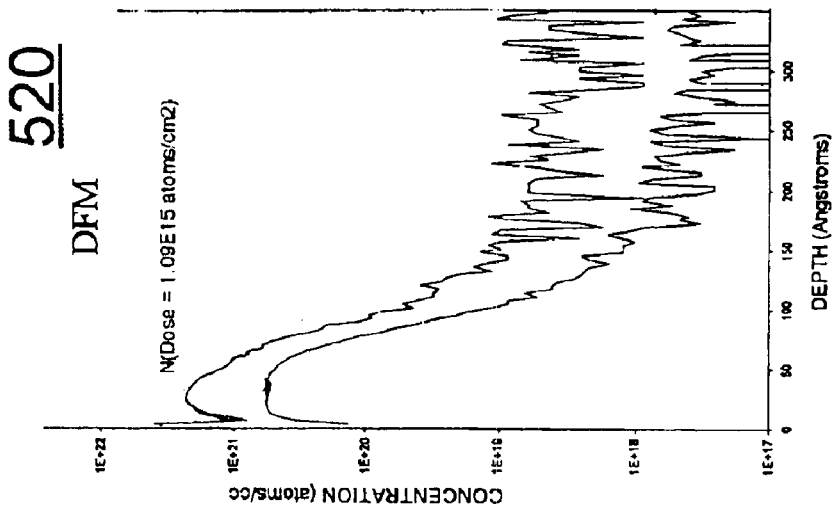
FIG. 5B is a plot showing nitrogen concentration versus dielectric depth for a second nitridation tool that provides a different distribution of plasma injected, nitrogen atoms.
Figure 5A:
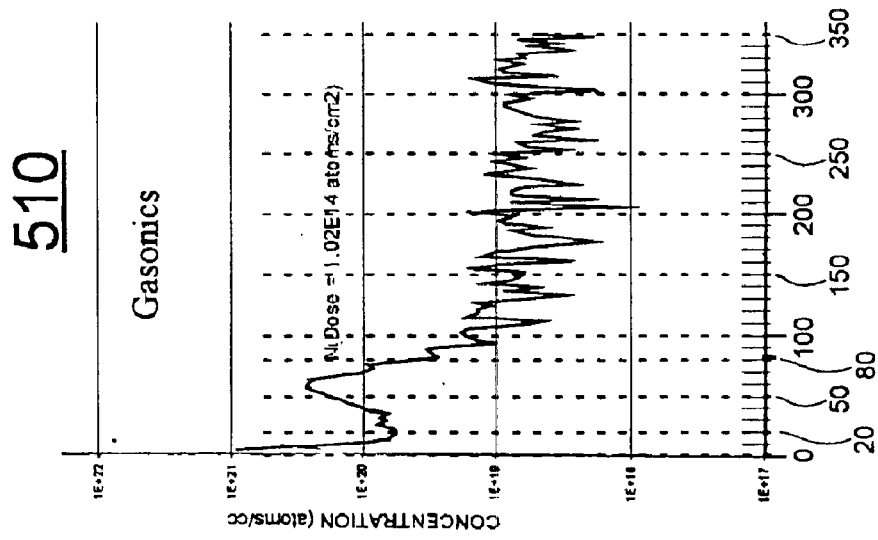
FIG. 5A is a plot showing nitrogen concentration versus dielectric depth for a nitridation tool that may be used in accordance with the disclosure.

Referring to FIG. 5A, a plot is shown of nitrogen concentration in an $SiO_2$ layer after a nitridation plasma treatment with the GaSonics PEP Iridia DL™ system. Nitrogen penetration depth is shown over the domain of 0 Å to 350 Å from the plasma-treated surface while nitrogen concentration is shown over the range of 1E+17 to 1E+22 nitrogen atoms per cubic centimeter (atoms/cc). It is seen that nitrogen atoms/cc drops below 1E+20 in the depth domain of about 10 Å to 40 Å. The nitrogen atoms/cc value is maximum at 0 Å and the next highest peak occurs in the penetration depth domain of about 50 Å to 70 Å. By around 80 Å the nitrogen atoms/cc value is again dropping below the 1E+20 reference line. Although the illustrated plot for distribution of nitrogen atoms in $SiO_2$, it is believed that a similar, double peak distribution of nitrogen and/or fluorine atoms occurs in metal oxides such as AlO when the GaSonics PEP Iridia DL™ system is used for corresponding nitridation and fluorination of the relatively thin metal oxide layers, e.g., those having a thickness in the range of about 70 Å to 100 Å. Therefore, a double peak distribution of nitrogen and fluorine atoms is believed to have occurred in the tested, 80 Å thick sample layer 345 of FIG. 3C. Even if this belief is incorrect, the improved resistance to leakage, as demonstrated by the results of FIG. 3C still remains valid.

FIG. 5B plots nitrogen concentration in an $SiO_2$ layer after a nitridation plasma treatment with a low temperature plasma tool (DFM) other the GaSonics PEP Iridia DL™ system. Nitrogen penetration depth is shown over the domain of 0 Å to 350 Å from the plasma-treated surface while nitrogen concentration is shown over the range of 1E+17 to 1E+22 nitrogen atoms per cubic centimeter (atoms/cc). As can be seen by comparing FIG. 5B against FIG. 5A, the plasma tool of FIG. 5B does not provide a reduced concentration of significant width and below 1E+20 reference line in the depth domain of 0 Å to 100 Å. Results from this second tool (FIG. 5B) have not been tested by the inventors and therefore it cannot be said yet whether a combination of fluorination and nitridation at low temperature will provide similar improvement in resistance to voltage breakdown as is evidenced by FIG. 3C.

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

Cross Reference to Related Other Publications

The following publications are cited here for purposes of reference and their disclosures are incorporated by reference:

(A) U.S. published application No. 2003/0082300 A1 published May 1, 2003, entitled "Improved Process for Deposition of Semiconductor Films", and naming as inventors: Todd et al.

(B) U.S. published application No. 2003/0166318 A1 published Sep. 4, 2003, entitled "Atomic Layer Deposition of Capacitor Dielectric", and naming as inventors: Zheng et al.

Reservation of Extra-Patent Rights, Resolution of Conflicts, and Interpretation of Terms After this disclosure is lawfully published, the owner of the present patent application has no objection to the reproduction by others of textual and graphic materials contained herein provided such reproduction is for the limited purpose of understanding the present disclosure of invention and of thereby promoting the useful arts and sciences. The owner does not however disclaim any other rights that may be lawfully associated with the disclosed materials, including but not limited to, copyrights in any computer program listings or art works or other works provided herein, and to trademark or trade dress rights that may be associated with coined terms or art works provided herein and to other otherwise-protectable subject matter included herein or otherwise derivable herefrom.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Unless expressly stated otherwise herein, ordinary terms have their corresponding ordinary meanings within the respective contexts of their presentations, and ordinary terms of art have their corresponding regular meanings within the relevant technical arts and within the respective contexts of their presentations herein.

Given the above disclosure of general concepts and specific embodiments, the scope of protection sought is to be defined by the claims appended hereto. The issued claims are not to be taken as limiting Applicant's right to claim disclosed, but not yet literally claimed subject matter by way of one or more further applications including those filed pursuant to 35 U.S.C. § 120 and/or 35 U.S.C. §251.

What is claimed is:

1. A method of increasing breakdown voltage for an amorphous metal-oxide composition ($X_{(a)}$—O) where the $X_{(a)}$—O composition is disposed to define a dielectric layer within a capacitive coupling structure and where the $X_{(a)}$—O composition has a respective recrystallization temperature where the recrystallization temperature of the $X_{(a)}$—O composition is a temperature above which the $X_{(a)}$—O composition can be heated to and thereafter cooled below, and as a result of the heating and cooling, the $X_{(a)}$—O composition becomes less amorphous and starts to exhibit significantly increased grain boundaries, the method comprising:

(a) incorporating nitrogen atoms into the amorphous metal-oxide composition ($X_{(a)}$—O) where the incorporation is carried out with the $X_{(a)}$—O composition being in a nitridation temperature range below the recrystallization temperature of the $X_{(a)}$—O composition.

2. The breakdown voltage increasing method of claim 1 wherein:

(a.1) said $X_{(a)}$—O composition includes an aluminum-oxide and the nitridation temperature range is below about 500° C.

3. The breakdown voltage increasing method of claim 2 wherein:

(a.2) said nitridation temperature range is below about 330° C.

4. The breakdown voltage increasing method of claim 3 wherein:

(a.2) said nitridation temperature range is between about 250° C. and about 330° C. inclusively.

5. The breakdown voltage increasing method of claim 3 wherein:

(a.2) said nitridation temperature range is centered roughly about 270° C.

6. The breakdown voltage increasing method of claim 1 wherein:

(a.1) said $X_{(a)}$—O composition is formed by an atomic layer deposition process that includes the chemical combining of aluminum with oxygen.

7. The breakdown voltage increasing method of claim 1 wherein:

(a.1) said $X_{(a)}$—O composition includes a tantalum-oxide and the nitridation temperature range is below about 700° C.

8. A method of increasing breakdown voltage for an amorphous metal-oxide composition ($X_{(a)}$—O) having a respective recrystallization temperature where the recrystallization temperature of the $X_{(a)}$—O composition is a temperature above which the $X_{(a)}$—O composition can be heated to and thereafter cooled below, and as a result of the heating and cooling, the $X_{(a)}$—O composition becomes less amorphous and starts to exhibit significantly increased grain boundaries, the method comprising:

(a) incorporating nitrogen atoms into the amorphous metal-oxide composition ($X_{(a)}$—O) where the incorporation is carried out with the $X_{(a)}$—O composition being in a nitridation temperature range below the recrystallization temperature of the $X_{(a)}$—O composition wherein:

(a.1) said $X_{(a)}$—O composition includes a hafnium-oxide and the nitridation temperature range is below about 400° C.

9. The breakdown voltage increasing method of claim 8 wherein:
(a.2) said nitridation temperature range is below about 330° C.

10. A method of increasing breakdown voltage for an amorphous metal-oxide composition ($X_{(a)}$—O) having a respective recrystallization temperature where the recrystallization temperature of the $X_{(a)}$—O composition is a temperature above which the $X_{(a)}$—O composition can be heated to and thereafter cooled below, and as a result of the heating and cooling, the $X_{(a)}$—O composition becomes less amorphous and starts to exhibit significantly increased grain boundaries, the method comprising:
(a) incorporating nitrogen atoms into the amorphous metal-oxide composition ($X_{(a)}$—O) where the incorporation is carried out with the $X_{(a)}$—O composition being in a nitridation temperature range below the recrystallization temperature of the $X_{(a)}$—O composition wherein:
(a.1) said $X_{(a)}$—O composition includes a titanium-oxide and the nitridation temperature range is below about 300° C.

11. The breakdown voltage increasing method of claim 10 wherein:
(a.2) said nitridation temperature range is centered about roughly 270° C.

12. A method of increasing breakdown voltage for an amorphous metal-oxide composition ($X_{(a)}$—O) having a respective recrystallization temperature where the recrystallization temperature of the $X_{(a)}$—O composition is a temperature above which the $X_{(a)}$—O composition can be heated to and thereafter cooled below, and as a result of the heating and cooling, the $X_{(a)}$—O composition becomes less amorphous and starts to exhibit significantly increased grain boundaries, the method comprising:
(a) incorporating nitrogen atoms into the amorphous metal-oxide composition ($X_{(a)}$—O) where the incorporation is carried out with the $X_{(a)}$—O composition being in a nitridation temperature range below the recrystallization temperature of the $X_{(a)}$—O composition and further comprising:
(b) introducing fluorine atoms into the $X_{(a)}$—O composition prior to or during the incorporating of the nitrogen atoms into the $X_{(a)}$—O composition, where said introducing of the fluorine atoms is carried out while the $X_{(a)}$—O composition is in a fluorination temperature range below the recrystallization temperature of the $X_{(a)}$—O composition.

13. The breakdown voltage increasing method of claim 12 wherein:
(a.1) said $X_{(a)}$—O composition includes an aluminum-oxide and the nitridation temperature range is between about 250° C. and about 330° C. inclusively; and
(b.1) the fluorination temperature range is between about 20° C. and about 90° C. inclusively.

14. The breakdown voltage increasing method of claim 12 wherein:
(a.1) said incorporating of the nitrogen atoms creates upper and lower nitridated layers within the $X_{(a)}$—O composition, where the upper and lower nitridated layers have respective first and second nitrogen concentrations of about a same order of magnitude and said incorporating of the nitrogen atoms defines an intermediate layer interposed between the upper and lower nitridated layers, where the intermediate layer has a respective third nitrogen concentration that is substantially smaller than either of the first and second nitrogen concentrations.

15. The breakdown voltage increasing method of claim 12 wherein:
(a.2) said intermediate layer has width of at least about 10 Å.

16. The breakdown voltage increasing method of claim 15 wherein:
(a.3) after said introduction of the nitrogen atoms, nitrogen concentration in said intermediate layer is less than about 1E+20 atoms per cubic centimeter.

17. The breakdown voltage increasing method of claim 15 wherein:
(a.3) each of said upper and lower nitridated layers has width of at least about 9 Å.

18. The breakdown voltage increasing method of claim 17 wherein:
(a.3) after said introduction of the nitrogen atoms, nitrogen concentration in said upper and lower nitridated layers is greater than about 1E+20 atoms per cubic centimeter.

19. The breakdown voltage increasing method of claim 12 wherein:
(a.2) said intermediate layer has width of at least about 30 Å.

20. The breakdown voltage increasing method of claim 12 wherein:
the fluorinated and nitridated $X_{(a)}$—O composition is further sandwiched between silicon oxide layers and the sandwiched combination has a thickness of no more than about 170 Å and the sandwiched combination can withstand a stressing voltage having an absolute magnitude between 0 V and about 12 V without entering a voltage breakdown mode.

21. A method of plasma treating an amorphous metal-oxide composition ($X_{(a)}$—O) wherein the $X_{(a)}$—O composition is disposed to define a dielectric layer within a capacitive coupling structure and where the $X_{(a)}$—O composition has a respective recrystallization temperature where the recrystallization temperature of the $X_{(a)}$—O composition is a temperature above which the $X_{(a)}$—O composition can be heated to and thereafter cooled below, and as a result of the heating and cooling, the $X_{(a)}$—O composition can becomes less amorphous and can start to exhibit grains of significantly increased size, said significantly increased size being associated with reduced breakdown voltage, the method comprising:
(a) subjecting the $X_{(a)}$—O composition to a plasma containing nitrogen atoms so as to incorporate at least some of the nitrogen atoms into the amorphous metal-oxide composition ($X_{(a)}$—O) where the incorporation is carried out while the $X_{(a)}$—O composition is at a nitridation temperature range below the recrystallization temperature of the $X_{(a)}$—O composition so as to inhibit recrystallization within the plasma-treated $X_{(a)}$—O composition.

22. The plasma-treatment method of claim 21 and further comprising:
(b) exposing the $X_{(a)}$—O composition to a plasma containing fluorine atoms so as to incorporate at least some of the fluorine atoms into the amorphous metal-oxide composition ($X_{(a)}$—O) where the incorporation is carried out while the $X_{(a)}$—O composition is at a fluorination temperature range below the recrystallization temperature of the $X_{(a)}$—O composition so as to inhibit recrystallization within the plasma-treated $X_{(a)}$—O composition.

23. The plasma-treatment method of claim 22 wherein:

(a.1) said subjecting step is carried out in a plasma tool which exhibits a multi-peak distribution of nitrogen when incorporating nitrogen atoms into an oxide dielectric;

(b.1) said exposing step is carried out in the same plasma tool as that of the subjecting step or in a similar plasma tool exhibiting multi-peak distribution.

24. A monolithically integrated device comprising:

(a) first and second conductive electrodes spaced apart from one another; and (b) an insulative structure interposed between the first and second conductive electrodes, where the insulative structure includes:

(b.1) a first insulative layer composed of an amorphous metal-oxide composition ($X_{(a)}$—O) having a dielectric constant greater than that of stoichiometric silicon nitride, the first insulative layer having upper and lower sublayers and an intermediate sublayer disposed between the upper and lower sublayers; and (b.2) nitrogen atoms incorporated at least into the upper and lower sublayers of the first insulative layer, where the incorporated nitrogen atoms have a concentration greater than about 1E+20 atoms per cubic centimeter in the upper and lower sublayers.

25. The monolithically integrated device of claim 24 and further wherein the insulative structure includes:

(b.3) fluorine atoms incorporated at least into the upper and lower sublayers of the first insulative layer, where the incorporated fluorine atoms have respective concentrations in the upper and lower sublayers that are substantially greater than fluorine concentration, if any, in the intermediate sublayer.

26. The monolithically integrated device of claim 24 wherein:

(b.1a) said $X_{(a)}$—O composition includes an aluminum-oxide.

27. The monolithically integrated device of claim 24 wherein:

(b.1a) said $X_{(a)}$—O composition is the product of an atomic layer deposition process that includes the chemical combining of a metal with oxygen.

28. The monolithically integrated device of claim 24 wherein:

(b.1a) said $X_{(a)}$—O composition includes a hafnium-oxide.

29. The monolithically integrated device of claim 24 and further wherein the insulative structure includes:

(b.3) a first silicon oxide layer interposed between the first insulative layer and one of the first and second conductive electrodes.

30. The monolithically integrated device of claim 24 and further wherein the insulative structure includes:

(b.4) a second silicon oxide layer interposed between the first insulative layer and the other of the first and second conductive electrodes.

31. The monolithically integrated device of claim 30 wherein said insulative structure and the first and second conductive electrodes define part of an electrically-reprogrammable, nonvolatile memory cell.

32. The monolithically integrated device of claim 31 wherein said memory cell further includes:

(c) a tunneling insulator disposed adjacent to one of said first and second conductive electrodes for insulatively mediating an introducing of charge into or a removing of charge from the one conductive electrode.

33. An insulative film structure comprising:

(a) a first insulative layer composed of an amorphous metal-oxide composition ($X_{(a)}$—O) having a dielectric constant greater than that of stoichiometric silicon nitride, the first insulative layer having upper and lower sublayers and an intermediate sublayer disposed between the upper and lower sublayers, where the first insulative layer has a thickness of less than about 100 Å; and (b) nitrogen atoms incorporated at least into the upper and lower sublayers of the first insulative layer, where the incorporated nitrogen atoms have respective first and second concentrations in the upper and lower sublayers, and where nitrogen concentration in the intermediate sublayer is substantially less than either of the first and second concentrations.

34. The insulative film structure of claim 33 and further comprising:

(c) fluorine atoms incorporated at least into the upper and lower sublayers of the first insulative layer, where the incorporated fluorine atoms have respective concentrations in the upper and lower sublayers that are substantially greater than fluorine concentration, if any, in the intermediate sublayer.

35. The insulative film structure of claim 33 and further comprising:

(c) a second insulative layer containing silicon atoms and disposed adjacent to the lower sublayer.

36. The insulative film structure of claim 35 and further wherein:

(c.1) the second insulative layer further includes at least one of oxygen atoms and nitrogen atoms.

* * * * *

UNITED STATES PATENT AND TRADEMARK OFFICE
CERTIFICATE OF CORRECTION

| | | |
|---|---|---|
| PATENT NO. | : 6,933,218 B1 | Page 1 of 1 |
| APPLICATION NO. | : 10/866380 | |
| DATED | : August 23, 2005 | |
| INVENTOR(S) | : Tai-Peng Lee et al. | |

It is certified that error appears in the above-identified patent and that said Letters Patent is hereby corrected as shown below:

Column 1, line 59 after "to" insert --be--

Column 2, line 3 delete "an" and insert --and--

Column 5, line 19 delete "an" and insert --and--

Column 12, line 56 delete "indicate" and insert --indicative--

Signed and Sealed this

Twenty-first Day of November, 2006

JON W. DUDAS
*Director of the United States Patent and Trademark Office*